(12) United States Patent
Jeon

(10) Patent No.: US 8,937,348 B2
(45) Date of Patent: Jan. 20, 2015

(54) 3-D NONVOLATILE MEMORY DEVICE, MEMORY SYSTEM, AND MANUFACTURING METHOD THEREOF

(75) Inventor: Yoo Nam Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 89 days.

(21) Appl. No.: 13/601,641

(22) Filed: Aug. 31, 2012

(65) Prior Publication Data
US 2013/0153983 A1    Jun. 20, 2013

(30) Foreign Application Priority Data

Dec. 19, 2011    (KR) .......................... 10-2011-0137344

(51) Int. Cl.
*H01L 29/792*    (2006.01)

(52) U.S. Cl.
USPC .......................................................... 257/324

(58) Field of Classification Search
CPC ..................... H01L 29/66833; H01L 29/7926; H01L 27/11582
USPC .......................................................... 257/324
See application file for complete search history.

(56) References Cited

U.S. PATENT DOCUMENTS

| 2011/0031547 | A1 | 2/2011 | Watanabe | |
| 2011/0291177 | A1* | 12/2011 | Lee et al. | 257/324 |
| 2012/0273867 | A1* | 11/2012 | Ko et al. | 257/324 |
| 2013/0207182 | A1* | 8/2013 | Lee et al. | 257/329 |

* cited by examiner

*Primary Examiner* — Shaun Campbell
(74) *Attorney, Agent, or Firm* — IP & T Group LLP

(57) ABSTRACT

A three dimensional (3-D) nonvolatile memory device includes a first pipe gate layer, a second pipe gate disposed over the first pipe gate layer, word lines formed over the second pipe gate layer, memory channel layers configured to penetrate the word lines, a pipe channel layer formed in the first pipe gate layer, where the pipe channel layer is to come in contact with the bottom surface of the second pipe gate layer and couple the lower ends of the memory channel layers, a memory layer configured to surround the pipe channel layer and the memory channel layers, and a first gate insulating layer interposed between the first pipe gate layer and the memory layer.

9 Claims, 6 Drawing Sheets

3-D NONVOLATILE MEMORY DEVICE, MEMORY SYSTEM, AND MANUFACTURING METHOD THEREOF

CROSS-REFERENCE TO RELATED APPLICATION

Priority to Korean patent application number 10-2011-0137344 filed on Dec. 19, 2011, the entire disclosure of which is incorporated by reference herein, is claimed.

BACKGROUND

Embodiments of this disclosure relate to a semiconductor device and a method of manufacturing the same and, more particularly, to a three-dimensional (3-D) nonvolatile memory device including a pipe gate, a memory system including the 3-D nonvolatile memory device, and a method of manufacturing the 3-D nonvolatile memory device.

A nonvolatile memory device retains data stored therein although the supply of power is cut off. As the recent improvement of the degree of integration of 2-D memory devices in which memory cells are formed in a single layer over a silicon substrate reaches the limit, there is proposed a 3-D nonvolatile memory device in which memory cells are vertically stacked in multiple layers from a silicon substrate.

The structure of a known 3-D nonvolatile memory device and problems thereof are described in detail below.

FIG. 1 is a perspective view showing the structure of a conventional 3-D nonvolatile memory device. Interlayer insulating layers are not shown in FIG. 1, for convenience of description.

As shown in FIG. 1, the conventional 3-D nonvolatile memory device includes a channel CH. The channel CH includes a pipe channel layer P_CH buried in a pipe gate PG and a pair of memory channel layers M_CH coupled to the pipe channel layer P_CH. The channel CH is surrounded by a tunnel insulating layer, a charge trap layer, and a charge blocking layer (not shown).

The 3-D nonvolatile memory device further includes word lines WL stacked to surround the memory channel layers M_CH and a source select line SSL and a drain select line DSL which are disposed over the word lines WL.

Strings that are adjacent to each other in a second direction II-II' are coupled to one source line SL in common, and the strings included in a string column extended in the second direction II-II' are coupled to a common bit lines BL.

In accordance with the above structure, the tunnel insulating layer, the charge trap layer, and the charge blocking layer that surround the pipe channel layer P_CH function as the gate insulating layer of the pipe gate. However, the tunnel insulating layer, the charge trap layer, and the charge blocking layer do not have a sufficient thickness for the gate insulating layer. Consequently, there is a problem in that the threshold voltage of the pipe gate rises due to the back tunneling of electrons when an erase operation is performed or the threshold voltages of memory cells are shifted by read disturbance.

BRIEF SUMMARY

An exemplary embodiment of this disclosure relates to a 3-D nonvolatile memory device in which a pipe gate includes a gate insulating layer having a sufficient thickness to prevent back tunneling of electrons, a memory system including the 3-D nonvolatile memory device, and a method of manufacturing the 3-D nonvolatile memory device.

In an aspect of this disclosure, a 3-D nonvolatile memory device includes a first pipe gate layer, a second pipe gate layer disposed over the first pipe gate layer, word lines formed in multiple layers over the second pipe gate layer, memory channel layers configured to penetrate the word lines, a pipe channel layer formed in the first pipe gate layer where the pipe channel layer to come in contact with the bottom surface of the second pipe gate layer and couple the lower ends of a pair of the memory channel layers, a memory layer configured to surround the pipe channel layer and the memory channel layers, and a first gate insulating layer interposed between the first pipe gate layer and the memory layer.

In another aspect of this disclosure, a memory system includes 3-D nonvolatile memory device configured to include a first pipe gate layer, a second pipe gate layer disposed over the first pipe gate layer, word lines stacked in multiple layers over the second pipe gate layer, memory channel layers configured to penetrate the word lines, a pipe channel layer formed in the first pipe gate layer, where the pipe channel layer is to come in contact with the bottom surface of the second pipe gate layer and couple the lower ends of a pair of the memory channel layers, a memory layer configured to surround the pipe channel layer and the memory channel layers, and a first gate insulating layer interposed between the first pipe gate layer and the memory layer; and a memory controller configured to control the nonvolatile memory device.

In yet another aspect of this disclosure, a method of manufacturing a 3-D nonvolatile memory device includes forming a first pipe gate layer by etching a first trench in a first conductive layer, forming a first gate insulating layer on the inside surface of the first trench, filling the first trench, on which the first gate insulating layer has been formed, with a sacrificial layer, forming a second pipe gate layer by etching a second conductive layer formed on the first pipe gate layer, alternately forming first material layers and second material layers over the second pipe gate layer, forming second trenches coupled to the first trench by etching the first material layers, the second material layers, and the conductive layer of the second pipe gate layer, removing the sacrificial layer, forming a memory layer on the inside surfaces of the first trench and of second trenches, and forming a channel layer over the memory layer.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
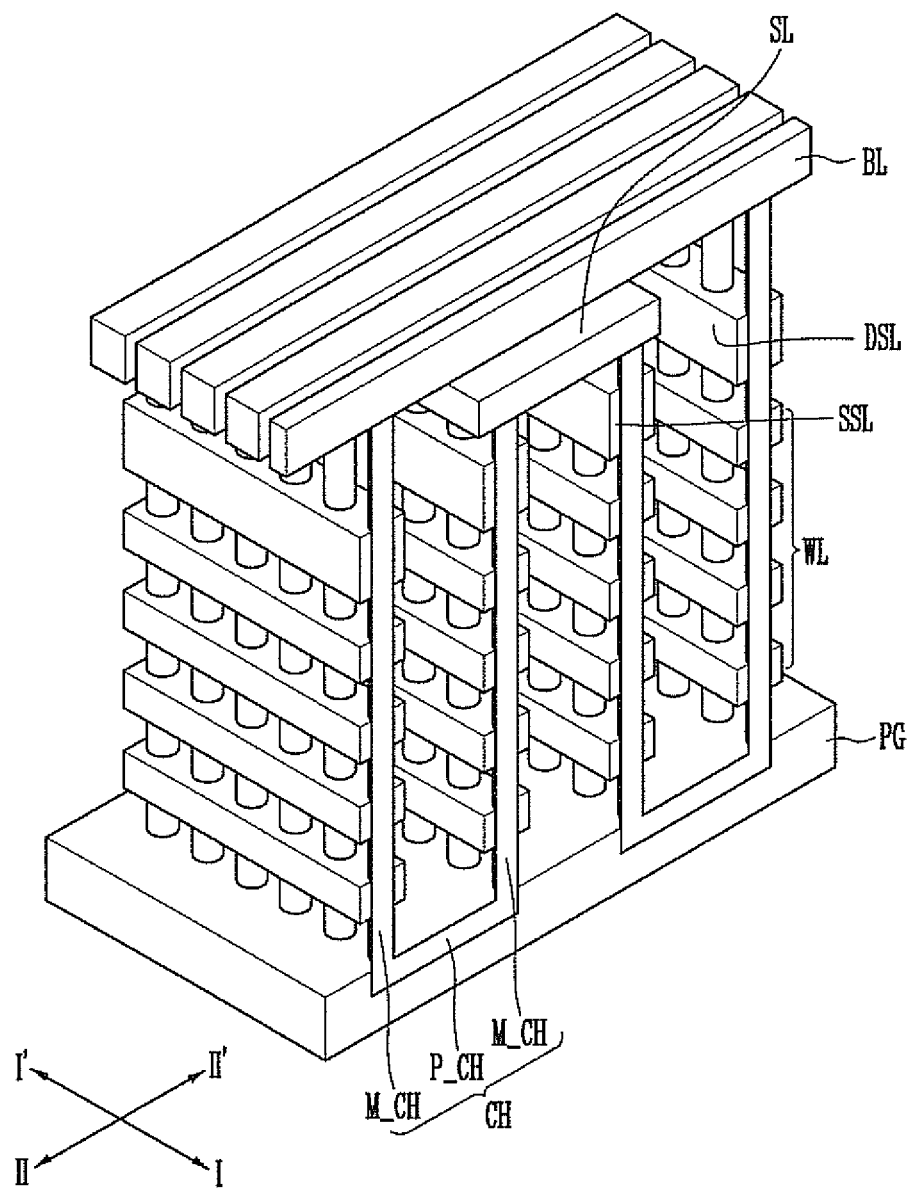
FIG. 1 is a perspective view showing the structure of a conventional 3-D nonvolatile memory device.
Figure 2A:
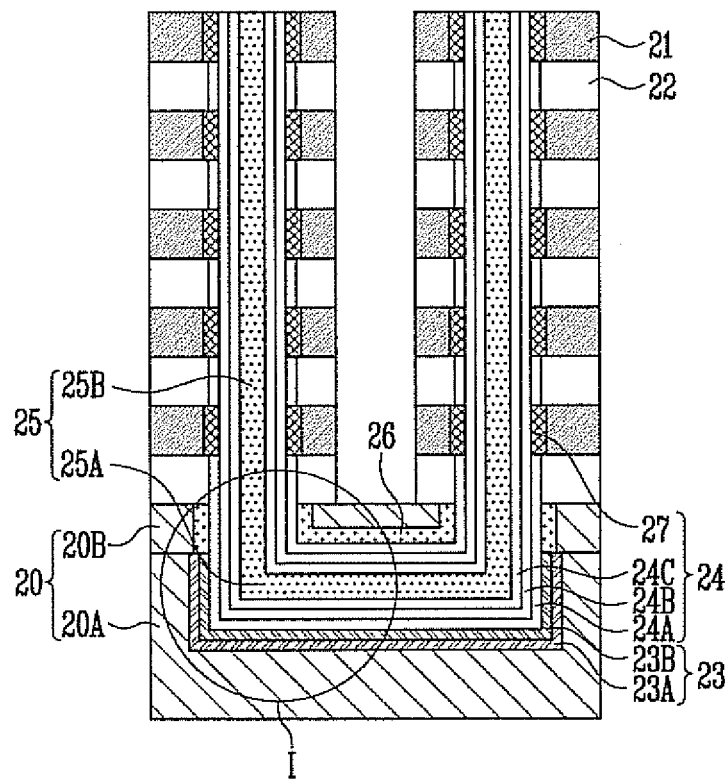
FIGS. 2A and 2B are cross-sectional views of a 3-D nonvolatile memory device according to one embodiment of this disclosure.
Figure 2B:
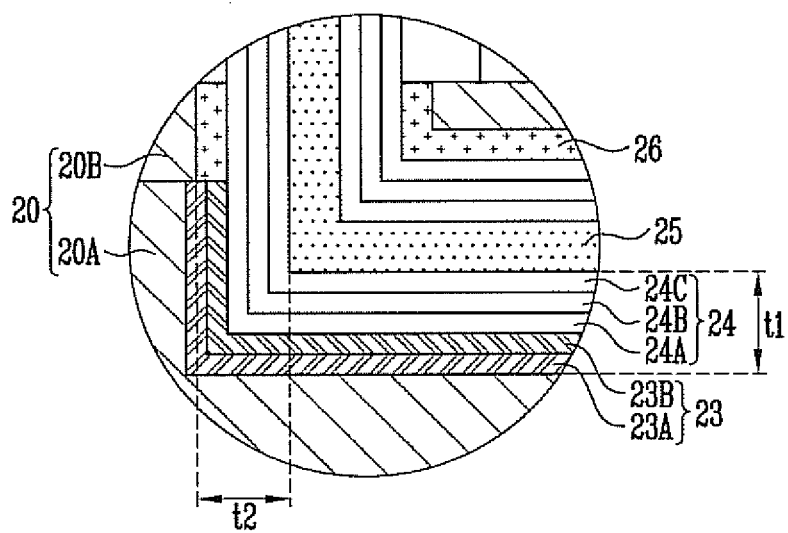

FIGS. 2A and 2B are cross-sectional views of a 3-D nonvolatile memory device according to one embodiment of this disclosure. In particular, FIG. 2B is an enlarged view of a region I in FIG. 2A.

As shown in FIGS. 2A and 2B, the 3-D nonvolatile memory device according to one embodiment of this disclosure includes a pipe gate 20, word lines 21 stacked in multiple layers over the pipe gate 20, memory channel layers 25B, and a pipe channel layer 25A formed in the pipe gate 20, where the pipe channel layer 25A is configured to couple lower ends of the memory channel layers 25B.

The pipe gate 20 includes a first pipe gate layer 20A and a second pipe gate layer 20B, formed on the first pipe gate layer 20A. The pipe channel layer 25A is configured to come in contact with the bottom surface of the second pipe gate layer 20B and is formed in the first pipe gate layer 20A. Furthermore, the pipe channel layer 25A couples lower ends of at least a pair of memory channel layers 25B.

The pipe channel layer 25A and the pair of memory channel layers 25B form a U-shaped channel 25. A memory layer 24 surrounds the entire surface of the U-shaped channel 25. The memory layer 24 includes a tunnel insulating layer 24C that surrounds the U-shaped channel 25, a charge trap layer 24B that surrounds the tunnel insulating layer 24C, and a charge blocking layer 24A that surrounds the charge trap layer 24B.

The memory layers 24 included in memory cells function to store data by injecting/discharging electric charges. In particular, the charge trap layer 24B functions as a substantial data repository, the tunnel insulating layer 24C functions as an energy barrier layer for the F-N tunneling of electric charges, and the charge blocking layer 24A functions to prevent electric charges, stored in the charge trap layer 24B, from moving to a gate.

Furthermore, the memory layer 24 included in a pipe gate 20 functions as a gate insulating layer. In accordance with one embodiment of this disclosure, since the first gate insulating layer 23 is interposed between the first pipe gate 20A and the memory layer 24, both the memory layer 24 and the first gate insulating layer 23 function as the gate insulating layer of the pipe gate 20. The first gate insulating layer 23 may be formed of a combination of an oxide layer and a nitride layer, and it may have a multi-layered stack structure of a nitride layer 23A and an oxide layer 23B.

The 3-D nonvolatile memory device may further include a second gate insulating layer 26 interposed between the second pipe gate layer 20B and the memory layer 24. The second gate insulating layer 26 may be an oxide layer that is formed by oxidizing a surface of the second pipe gate layer 20B.

The 3-D nonvolatile memory device includes the memory layer 24. A region 27 interposed between each of the word lines 21 and the charge trap layer 24B, from the charge blocking layer 24A of the memory layer 24, may have a thicker thickness than other regions of the charge blocking layer 24A.

In accordance with the present embodiment, the pipe gate 20 includes the gate insulating layer having a sufficient thickness. In particular, since the bottom and side of the pipe channel layer 25A formed in the first pipe gate 20A are surrounded by the memory layer 24 and the first gate insulating layer 23, the memory layer 24 and the first gate insulating layer 23 which have total thickness t1 function as the gate insulating layer Furthermore, since the top of the pipe channel layer 25A formed in the first pipe gate 20A and the side of the memory channel layer 25B formed in the second pipe gate layer 20B are surrounded by the memory layer 24 and the second gate insulating layer 26, the memory layer 24 and the second gate insulating layer 26 which have a total thickness t2 function as the gate insulating layer. Accordingly, a rise in the threshold voltage of the pipe gate due to the back tunneling of electrons when an erase operation is performed can be prevented, or a shift in the threshold voltages of memory cells due to read disturbance can be prevented.

FIGS. 3A to 3D are cross-sectional views illustrating a method of manufacturing a 3-D nonvolatile memory device according to one embodiment of this disclosure.

Figure 3A:
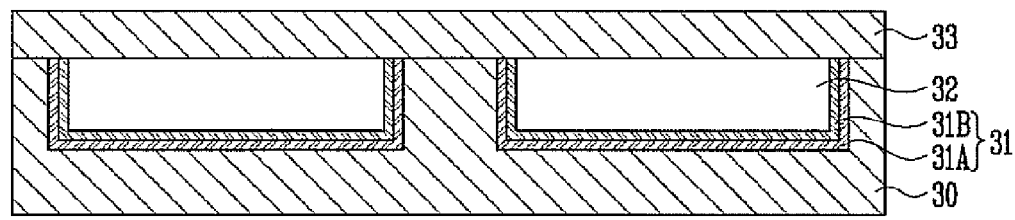
FIGS. 3A to 3D are cross-sectional views illustrating a method of manufacturing a 3-D nonvolatile memory device according to one embodiment of this disclosure.

As shown in FIG. 3A, first pipe trenches are formed by etching a conductive layer 30 for a first pipe gate. The first pipe trenches each have an island form, and they may be arranged in a matrix form.

A first gate insulating layer 31 is formed on the insides of the first pipe trenches. A sacrificial layer 32 is formed in the first pipe trenches on which the first gate insulating layer 31 is formed.

For example, after forming the first gate insulating layer 31 on the entire surface of the conductive layer 30 in which the first pipe trenches are formed, the sacrificial layer 32 may be formed to fill the first pipe trenches fully. Next, a polishing process is performed so that a surface of the conductive layer 30 for a first pipe gate is exposed.

The first gate insulating layer 31 may have a stack structure of a nitride layer 31A and an oxide layer 31B, and the sacrificial layer 32 may be formed of an oxide layer, a nitride layer, or a titanium nitride layer. In particular, since the first gate insulating layer 31 remains intact without being etched in a subsequent process of removing the sacrificial layer 32, the first gate insulating layer 31 and the sacrificial layer 32 are made of materials having a great etch selectivity difference. Furthermore, if the first gate insulating layer 31 has the stack structure as described above, a layer placed at the top and the sacrificial layer 32 are made of materials having a great etch selectivity difference.

A conductive layer 33 for a second pipe gate is formed on the conductive layer 30 for a first pipe gate in which the sacrificial layers 32 are formed.

Figure 3B:
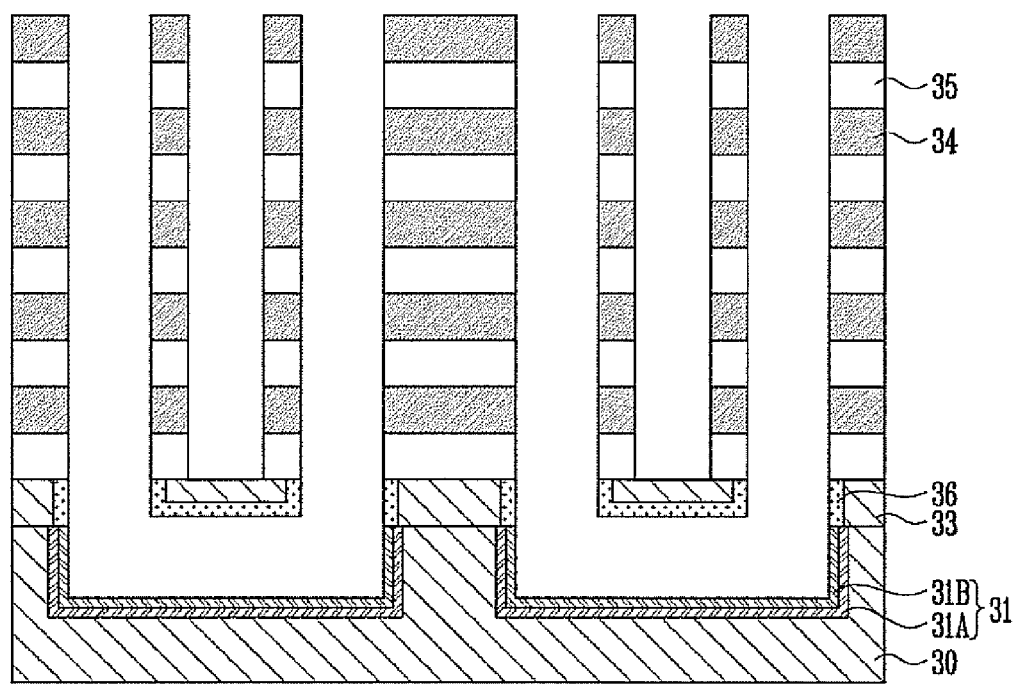

As shown in FIG. 3B, first material layers 34 and second material layers 35 are alternately formed over the conductive layer 33 for a second pipe gate. The first material layer 34 and the second material layer 35 are made of materials having a great etch selectivity difference. For example, the first material layer 34 may be formed of a conductive layer or a sacrificial layer, and the second material layer 35 may be formed of an interlayer insulating layer or a sacrificial layer.

For example, the first material layer 34 may be formed of a conductive layer, such as a polysilicon layer, and the second material layer 35 may be formed of an insulating layer, such as an oxide layer. For another example, the first material layer 34 may be formed of a conductive layer, such as a doped polysilicon layer or a doped amorphous silicon layer, and the second material layer 35 may be formed of a sacrificial layer, such as an undoped polysilicon layer or an undoped amorphous silicon layer. For yet another example, the first material layer 34 may be formed of a sacrificial layer, such as a nitride layer, and the second material layer 35 may be formed of an insulating layer, such as an oxide layer.

Second trenches are formed by etching the first material layers 34, the second material layers 35, and the conductive layer 33 for a second pipe gate. The second trenches are formed so that a pair of the second trenches is coupled to each of the first trenches.

The sacrificial layer 32 exposed to the bottom of the second trenches is removed. Here, the sacrificial layer 32 is selectively removed on condition that a difference between the etch selectivity of the sacrificial layer 32 and the etch selectivity of the first gate insulating layer 31 is great. For example, the sacrificial layer 32 may be removed by a phosphoric acid dip-out process. Prior to the removal of the sacrificial layer 32, a passivation layer (not shown) for preventing damage to the first material layers 34 and the second material layers 35 may be formed on the inner walls of the second trenches. As a result, U-shaped trenches, each formed of the first trench and the pair of second trenches coupled to the first trench, are formed.

A second gate insulating layer 36 may be formed on surfaces of the conductive layers 33 for second pipe gates which are exposed to the insides of the first trenches and the second trenches. For example, the second gate insulating layer 36 may be formed by an oxidization process, and the thickness of the second gate insulating layer 36 may be adjusted by controlling conditions of the oxidization process.

Figure 3C:
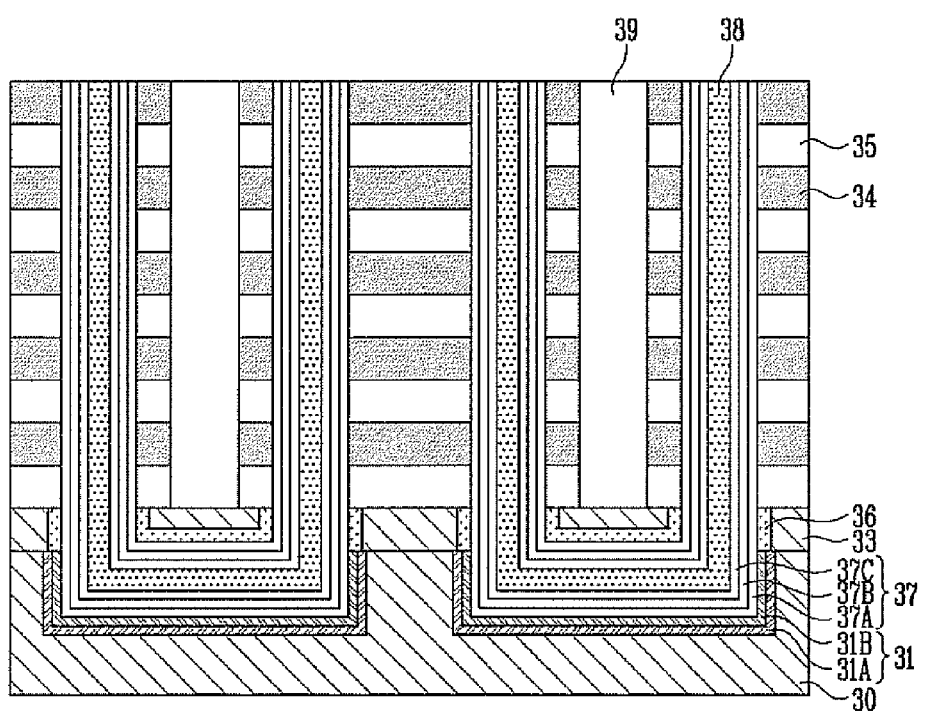

As shown in FIG. 3C, a memory layer 37 is formed on the insides of the first trenches and the second trenches. For example, a first charge blocking layer 37A, a charge trap layer 37B, and a tunnel insulating layer 37C are sequentially formed on the insides of the first trenches and the second trenches.

A channel layer 38 is formed on the memory layer 37. As a result, a pipe channel layer is formed in the pipe gates 30 and 33, and a pair of memory channel layers coupled to the pipe channel layer is formed. The channel layer 38 may be formed so that the U-shaped trench is fully filled or the central region of the U-shaped trench is opened. If the central region of the U-shaped trench is opened, the opened central region is filled with an insulating layer.

Next, at least one slit placed between memory channel layers adjacent to each other is formed by etching the first material layers 34 and the second material layers 35. The slit may be formed between adjacent memory channel layers of all the memory channel layers or may be formed between some of all the adjacent memory channel layers.

Figure 3D:
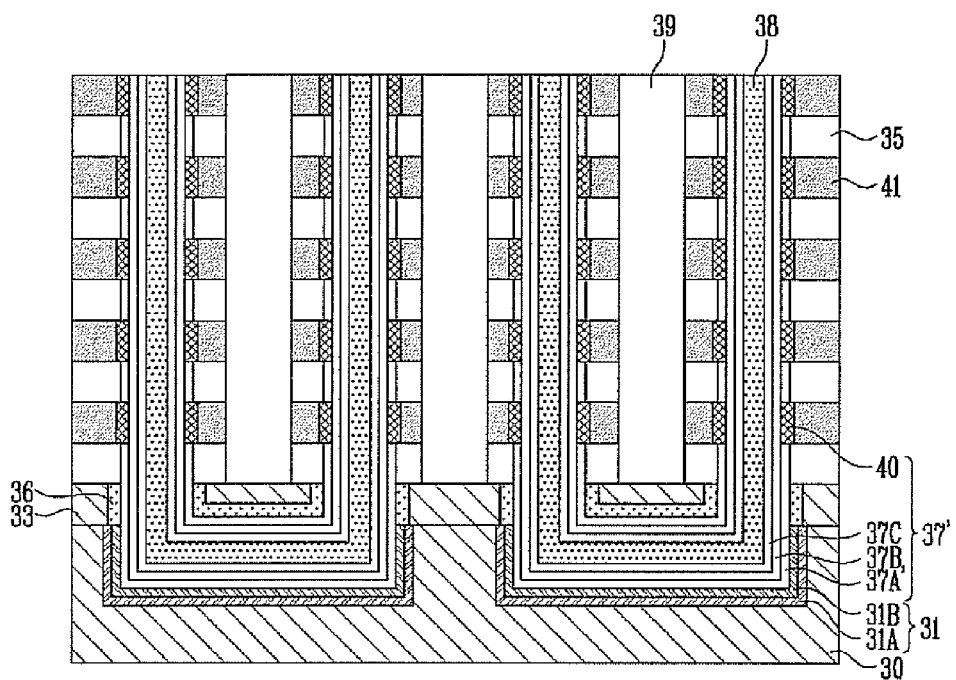

As shown in FIG. 3D, an insulating layer 39 is formed in the slits. Prior to the formation of the insulating layer 39, an additional process may be performed depending on materials that form the first material layers 34 and the second material layers 35.

For example, if the first material layer 34 is formed of a conductive layer and the second material layer 35 is formed of an insulating layer, the first material layers 34 exposed to the slit may be silicided and the insulating layer 39 may be then formed in the slit. As a result, a memory cell manufacture process is completed.

For another example, if the first material layer 34 is formed of a conductive layer and the second material layer 35 is formed of a sacrificial layer, the second material layers 35 exposed to the slit may be removed and the insulating layer 39 may be formed in the slit and the regions from which the second material layers 35 have been removed. As a result, a memory cell manufacture process is completed.

For yet another example, the first material layer 34 may be formed of a sacrificial layer, and the second material layer 35 may be formed of an insulating layer. In this case, as shown in FIG. 3D, the first material layers 34 exposed to the slit are removed. Next, the first charge blocking layer 37A exposed by removing the first material layers 34 are etched, and a second charge blocking layer 40 is then formed. In some embodiments, the second charge blocking layer 40 may be formed by oxidizing the first charge blocking layer 37 exposed by removing the first material layers 34. Word lines 41 are formed by filling the regions from which the first material layers 34 have been removed with a conductive layer. Next, the slit is filled with the insulating layer 39. As a result, a memory cell manufacture process is completed. Here, the second charge blocking layer 40 may have a thicker thickness than a first charge blocking layer 37A'. For example, the second charge blocking layer 40 interposed between the charge trap layer 37B and each of the word lines 41 may have a thicker thickness than the first charge blocking layer 37A' interposed between the interlayer insulating layers 35 and the charge trap layer 37B and between the second gate insulating layer 36 and the charge trap layer 37B.

If the second charge blocking layers 40 are formed as described above, damage to the first charge blocking layer 37 occurring when removing the first material layers 34 can be cured.

In accordance with the above manufacture method, the insulating layer of the pipe gates 30 and 33 can be easily increased and damage to the charge blocking layer can be cured.

Figure 4:
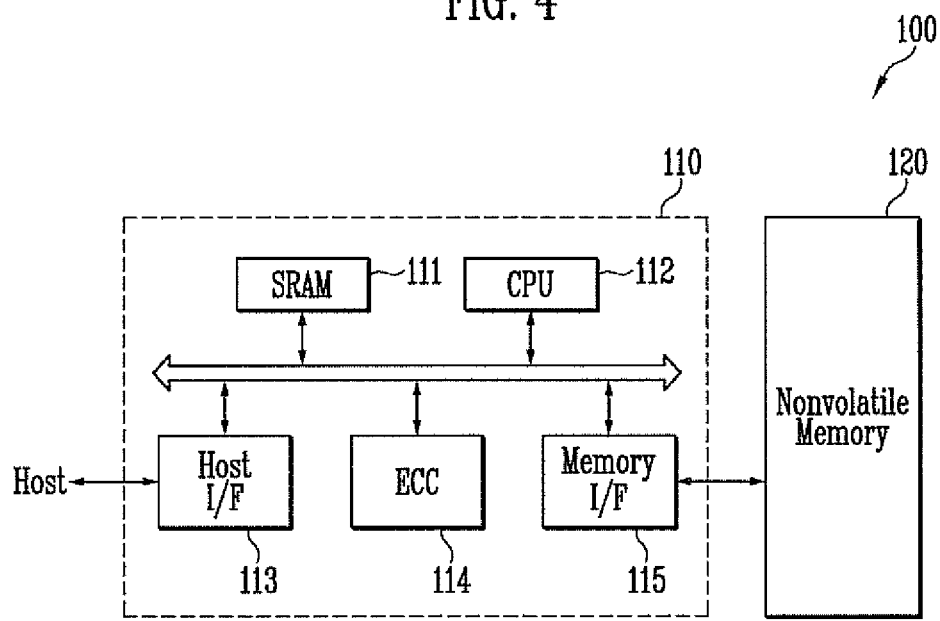
FIG. 4 shows the construction of a memory system according to one embodiment of this disclosure.

FIG. 4 shows the construction of a memory system according to one embodiment of this disclosure.

As shown in FIG. 4, the memory system 100 according to one embodiment of this disclosure includes a nonvolatile memory device 120 and a memory controller 110.

The nonvolatile memory device 120 is configured to have the cell array described with reference to FIGS. 2 and 3A to 3D. In some embodiments, the non-volatile memory device 120 may be a multi-chip package including a plurality of flash memory chips.

The memory controller 110 is configured to control the nonvolatile memory device 120, and it may include SRAM 111, a central processing unit (CPU) 112, a host interface (I/F) 113, an error correction code (ECC) circuit 114, and a memory interface (I/F) 115. The SRAM 111 is used as the operating memory of the CPU 112. The CPU 112 performs an overall control operation for the data exchange of the memory controller 110. The host I/F 113 is equipped with the data exchange protocol of a host that accesses the memory system 100. Furthermore, the ECC circuit 114 circuit detects and corrects errors included in data read from the nonvolatile memory device 120. The memory I/F 115 performs an interface with the nonvolatile memory device 120. The memory controller 110 may further include ROM for storing code data for an interface with the host.

The memory system 100 configured as described above may be a memory card or a solid state disk (SSD) in which the nonvolatile memory device 120 and the controller 110 are combined. For example, if the memory system 100 is an SSD, the memory controller 110 may communicate with the outside (for example, a host) through one of various interface protocols, such as a USB, MMC, PCI-E, SATA, PATA, SCSI, ESDI, and IDE.

Figure 5:
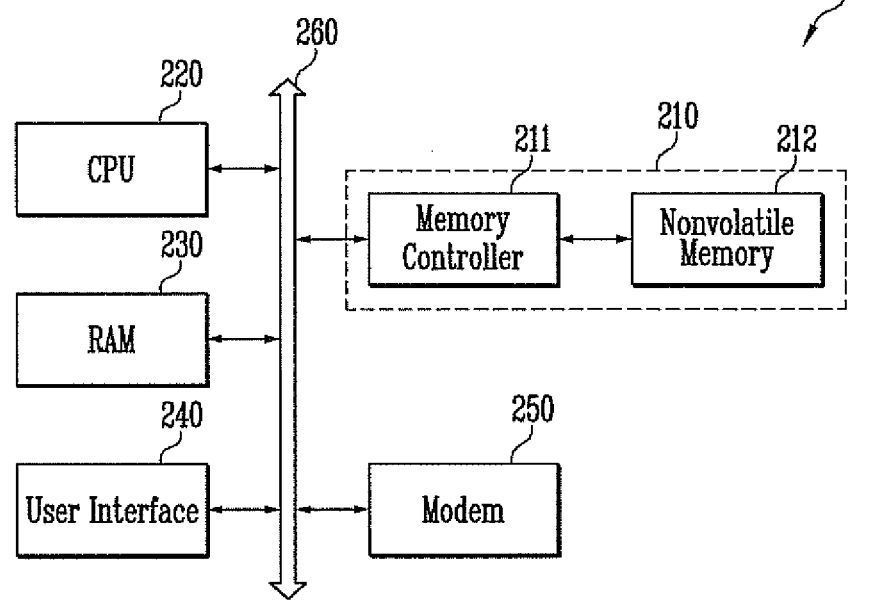
FIG. 5 shows the construction of a computing system according to one embodiment of this disclosure.

FIG. 5 shows the construction of a computing system according to one embodiment of this disclosure.

As shown in FIG. 5, the computing system 200 according to the embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on.

The memory system 210 may include a non-volatile memory device 212 and a memory controller 211, such as those described with reference to shown in FIG. 4.

The 3-D nonvolatile memory device includes the first gate insulating layer between the first pipe gate and the memory layer and the second gate insulating layer between the second pipe gate and the memory layer. Thus, the pipe gate includes a gate insulating layer having a sufficient thickness. Accordingly, a rise in the threshold voltage of a pipe gate due to the back tunneling of electrons when an erase operation is performed or a shift in the threshold voltages of memory cells due to read disturbance can be prevented.

What is claimed is:

1. A three dimensional (3-D) nonvolatile memory device, comprising:
    a first pipe gate layer;
    a second pipe gate disposed over the first pipe gate layer and contacting the first pipe gate layer;
    word lines formed over the second pipe gate layer;
    memory channel layers configured to penetrate the word lines;
    a pipe channel layer formed in the first pipe gate layer and coupling lower ends of the memory channel layers;
    a memory layer configured to surround the pipe channel layer and the memory channel layers; and
    a first gate insulating layer interposed between the first pipe gate layer and the memory layer.

2. The 3-D nonvolatile memory device of claim 1, further comprising:
    a second gate insulating layer interposed between the second pipe gate layer and the memory layer.

3. The 3-D nonvolatile memory device of claim 1, wherein the first gate insulating layer includes an oxide layer and a nitride layer.

4. The 3-D nonvolatile memory device of claim 1, wherein the memory layer comprises:
    a tunnel insulating layer configured to surround the memory channel layer,
    a charge trap layer configured to surround the tunnel insulating layer, and
    a charge blocking layer configured to surround the charge trap layer.

5. The 3-D nonvolatile memory device of claim 4, wherein a region of the charge blocking layer interposed between each of the word lines and the charge trap layer is thicker than other regions of the charge blocking layer.

6. A memory system, comprising:
    a 3-D nonvolatile memory device configured to comprise a first pipe gate layer,
    a second pipe gate layer disposed over the first pipe gate layer and contacting the first pipe gate layer,
    word lines stacked over the second pipe gate layer,
    memory channel layers configured to penetrate the word lines,
    a pipe channel layer formed in the first pipe gate layer and coupling lower ends of the memory channel layers,
    a memory layer configured to surround the pipe channel layer and the memory channel layers, and
    a first gate insulating layer interposed between the first pipe gate layer and the memory layer; and
    a memory controller configured to control the nonvolatile memory device.

7. The memory system of claim 6, further comprising:
    a second gate insulating layer interposed between the second pipe gate layer and the memory layer.

8. The memory system of claim 6, wherein the memory layer comprises:
    a tunnel insulating layer configured to surround the memory channel layer;
    a charge trap layer configured to surround the tunnel insulating layer; and
    a charge blocking layer configured to surround the charge trap layer.

9. The memory system of claim 8, wherein a region of the charge blocking layer interposed between each of the word lines and the charge trap layer, is thicker than other regions of the charge blocking layer.

* * * * *